United States Patent [19]

Loftness

[11] Patent Number: 4,613,831

[45] Date of Patent: Sep. 23, 1986

[54] AUDIO, ULTRASONIC AND RF NOISE GENERATOR FOR DEMONSTRATION OF ELECTRICAL INTERFERENCE

[76] Inventor: Marvin O. Loftness, 115 W. 20th Ave., Olympia, Wash. 98501

[21] Appl. No.: 788,026

[22] Filed: Oct. 16, 1985

[51] Int. Cl.$^4$ .................... H03B 29/00; H01J 1/00
[52] U.S. Cl. .................... 331/78; 331/68; 340/384 E; 455/1; 313/235
[58] Field of Search .......... 331/68, 78; 332/8; 340/384 E; 455/1; 313/235

[56] References Cited
U.S. PATENT DOCUMENTS
976,778  11/1910  Brown ......................... 313/235

*Primary Examiner*—Eugene R. LaRoche
*Assistant Examiner*—D. C. Mis

[57] ABSTRACT

A portable low-output-level generator producing simultaneous audio, ultrasonic and RF noise for the test and demonstration of instruments designed to locate electrical interference, for demonstration of the broad frequency spectrum of electrical noise radiation, for antenna tests, to test the EMI susceptibility of electronic equipment, and to illustrate the effects of said noise on TV and radio receivers. This generator is enclosed in a housing and communicates audio and ultrasonic sounds to the observer via a vibrating diaphragm mounted on the face of the housing, with means provided to attenuate the audio sounds relative to the ultrasonic, and this generator radiates RF from a retractable antenna mounted on and extending outward from the housing.

14 Claims, 5 Drawing Figures

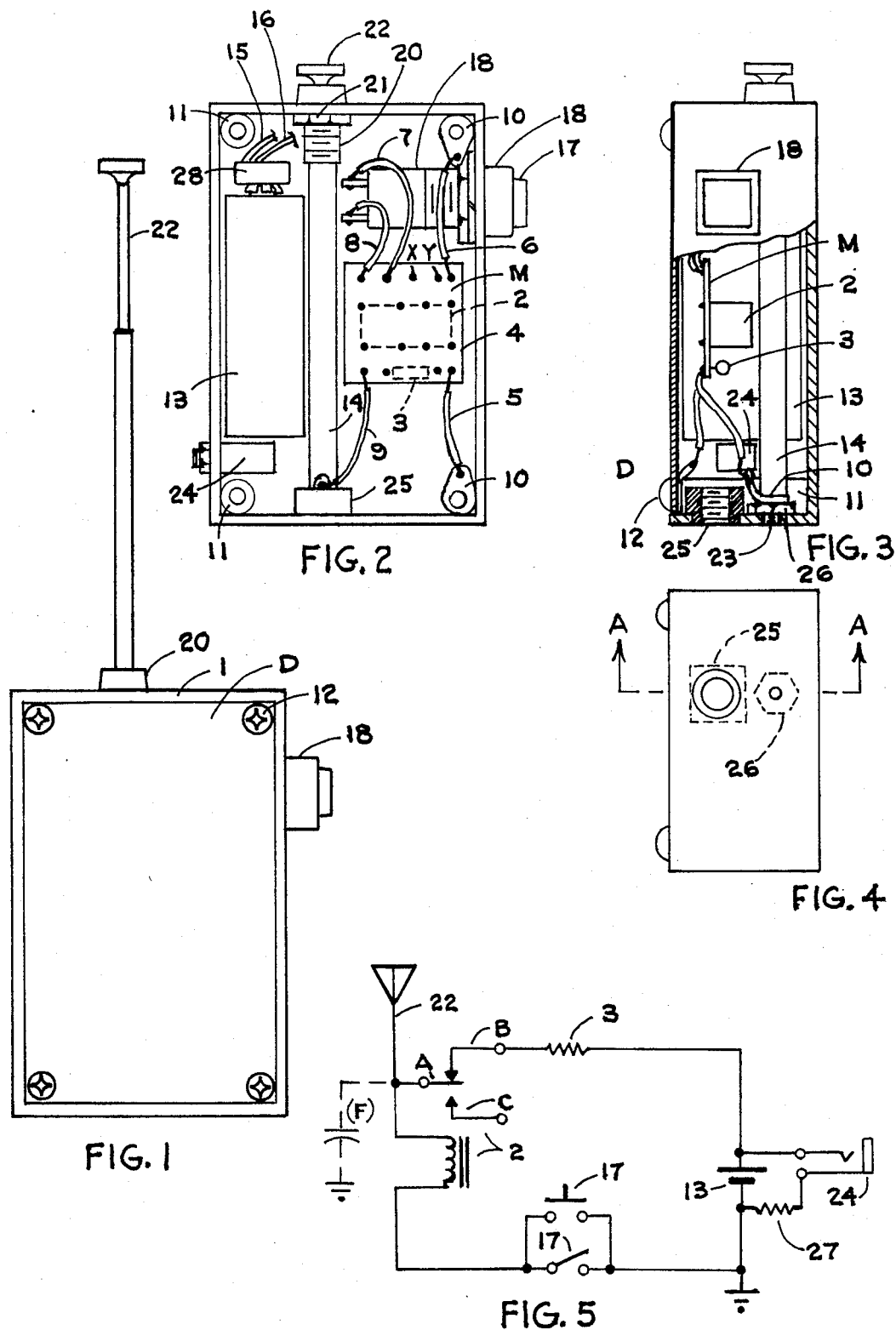

AUDIO, ULTRASONIC AND RF NOISE GENERATOR FOR DEMONSTRATION OF ELECTRICAL INTERFERENCE

BACKGROUND OF THE INVENTION

Experience and research have shown that radio and television interference from power lines is mostly caused by arcing ocurring in power line components such as conductor or insulator connections, or other hardware connections. The most troublesome and relatively numerous arcs are the transient arcs or "sparks." These are very small arcs where the arcing gap is usually less than 0.01" across. Sparks then occur where supposedly mating metal-to-metal surfaces are slightly separated by corrosion and/or looseness and these components are in the leakage path of one phase conductor to ground or such conductor to another phase conductor, resulting in a voltage difference between the separated components.

There are numerous possible sites on a power pole or structure where sparking can occur, and such sparking can cause serious television and radio interference, particularly in weak reception areas.

I have found that in the course of making an interference investigation, it is very helpful to have a noise test source of some type readily available to occasionally check the operating condition of my locating equipment.

In explaining the operation of my locating equipment to others it is most convenient to have a portable sparking source at hand to demonstrate the sensitivity and directivity of my equipment.

In discussing power line interference at a complainant's residence it is effective to be able to demonstrate how electrical interference appears on a TV set or sounds on a radio set.

Rather frequently when the investigator of a television or radio complaint first visits the complainant, he finds that no interference is present at the time, because of the intermittent nature of many sources. Then, assuming a TVI complaint, the visit is meaningful if he can use his portable noise source to simulate electrical interference. The complainant can then observe the pattern of this interference on his TV and reply with "yes that's what it looks like," or "that's it all right, but its never quite that bad," or some similar statement. The complainant is assured that the investigator is knowledgeable on the subject of interference and that he knows what to look for in his investigation.

If some strong and some weak TV stations are being received, the investigator may then, with his portable noise source, demonstrate the effects of signal-to-noise ratio on a TV set; that is, demonstrate how much easier it is to interfere with a weak station than a strong; and explain why it is important to have a good antenna pointing in the right direction to increase signal strength to the set to reduce the effects of outside interference.

He may also impress the complainant that if he, the investigator, can so readily cause what looks like power line interference with his portable noise device, the problem might also be some other electrical device in the complainant's home.

For example, on his first visit with the complainant, the investigator may find no interference but be advised that it almost always comes on at about 7 PM. Returning then at about that time he finds it to come on at 7:10 PM; he then isolates the problem to a sparking hot water heater thermostat. This is an easy one, and—assuming in this case the investigator to be a power company employee—the complainant becomes a pleased customer of the power company.

Most often, however, if the complaint is made to the power company, the interference is found to be the result of power line problems. Frequently, of course, interference is intermittent and it may not be "on" when the first visit is made.

Some of the locating instruments in use have a very low inherent background noise output, and the operator cannot always be sure that the instrument used is "on" and in sensitive operating condition. Here the said invention is a helpful aid.

A noise source that simulates electrical noise or interference is very helpful in a classroom situation where power line interference is being discussed, or in a sales presentation where location equipment is being promoted.

Lecture or sales persons have in the past used old "Ford spark coils," neon sign transformers, or ignition or fence charger transformers with spark plugs or other type gaps to simulate power line interference. These are effective but are bulky and inconvenient to set up and also generate a higher level of noise than is required for the demonstration. Further, the use of such transformers may present a safety hazard.

For a discussion of power line and electrical interference, and a discussion of interference locating methods see:

"The Location, Correction and Prevention of RI and TVI Sources from Overhead Power Lines" an IEEE Tutorial publication 76CH1163-5-PWR, July 1976.

For a discussion of interference locators, see my U.S. Pat. No. 4,439,723. See also U.S. Pat. No. 3,820,018.

SUMMARY OF THE INVENTION

The main purpose of this invention is to provide a generator which produces audio, ultrasonic and RF noise radiations to simulate electrical interference for demonstration purposes.

Another purpose is to provide a generator suitable for the testing of instruments designed for: the locating of power line interference or locating other electrical equipment interference—with this testing being performed routinely during the couse of an investigation to assure that instruments are in a sensitive operating condition.

Another purpose is to provide a generator that produces audio, ultrasonic and RF noise radiations simultaneously.

A further purpose is to provide such a generator with a provision for reduced audio with respect to the ultrasonic emmissions, in order to enhance the demonstration of the ultrasonic output.

Another purpose is to provide a generator in a small pocket size for convenience in carrying in the field, along with other instruments the investigator may require.

An additional purpose is to provide a generator that does not require a high voltage for its operation, but operates on a safe low voltage, typically 6-9 volts.

Another purpose is to provide such a generator with an internal battery power source in order that it can be operated in locations where no power service is available.

A further purpose is to provide a generator which is battery-operated and thus has no AC line-cord attached; such a cord which may act as a radiating antenna or noise conductor and thus distract from the main purpose of a demonstration.

Another purpose is to provide a generator with low-level RF output so as not to be observed at any but very nearby radio and television sets.

Another purpose is to provide a generator using a very small spark gap as its generating source in order to closely simulate most electrical sources and particularly sparking on power lines.

A further purpose is to provide a generator which uses a small electromagnetic relay in an oscillatory circuit where the required sparking occurs in the back contacts of this relay.

Another purpose is to provide a generator with a retractable antenna so as to maintain the pocket-size requirement without the operator carrying a separate plug-in antenna.

An additional purpose is to provide a generator suitable for demonstration purposes in a sales setting in order to show the sensitivity and pin-point ability of various instruments.

A further purpose is to provide a generator with reduced level audio output for use in a demonstration situation where the generator is hidden. Here participants in a staged noise search are not able to audibly hear the source but must rather rely on their locating instruments to find the source.

Another purpose of the generator is to demonstrate the broad frequency spectrum of electrical and power line noise. This is done by showing that the observer can hear the audio from the generator at a frequency of few hundred Hertz; he can detect the ultrasonic with the proper instrument at approximately 40 kHz; he can detect the RF at 1.0 MHz on a transistor radio, at 100 MHz with the proper very high frequency (VHF) detector and at 800 MHz with the proper ultra high frequency (UHF) detector.

A further purpose of the invention is to provide assistance in locating sites of electromagnetic interference (EMI) susceptibility in cables, amplifiers, receivers and other RF and electronic equipment, such as equipment at cable TV head-end sites.

Another purpose is to provide an "isolated" noise source for relative sensitivity tests, front-to-back ratio tests and other antenna tests in the medium frequency (MF) through the UHF ranges; this including tests of satellite receiving antennas.

An additional purpose of the invention is that it may be readily modified to limit the RF radiation to either medium frequencies, or to very high frequencies and above—such a modification being desireable for certain tests.

A BRIEF DESCRIPTION OF THE DRAWINGS

FIG. 1 is a front elevation of the completely assembled invention.

FIG. 2 is the same elevation as FIG. 1, but with the diaphragm/cover removed.

FIG. 3 is a side elevation, partly in section, taken on the line A—A of FIG. 4.

FIG. 4 is a bottom view of the assembly.

FIG. 5 is a schematic diagram of the noise generator.

PREFERRED EMBODIMENTS

The enclosure consists of a plastic or metal housing 1 and a thin plastic or metal diaphragm D which also acts as a housing cover. The source within the enclosure of audio, ultrasonic and RF noise is the noise module M, which consists of the miniature electromagnetic relay 2 and the resistor 3 mounted on the printed circuit board 4.

The noise module M is supported mechanically by the small-gauge stranded and plastic covered wires 5, 6, 7, 8, and 9; these wires also provide electrical connections in the circuit. The module touches no parts of the enclosure or components within the enclosure except through the said connecting wires. This manner of suspension reduces the level of audio transmitted through the walls of the enclosure and the diaphragm D to a suitable level for the demonstrations required, but permits a relatively high level of ultrasonic to emanate from the enclosure via the diaphragm also as required for the demonstrations.

Note that the wires 5 and 6 are connected to solder lugs 10 which in turn are cemented to or otherwise fastened to the internally threaded mounting stand-offs 11 molded into or mounted in the enclosure; these lugs are securely held by the diaphragm mounting screws 12.

The low voltage (typically 9 V battery 13 supplying power to the generator is held in place by the side of the enclosure, the base portion of the antenna assembly 14, the miniature phone-type battery-charge jack 24, and the diaphragm/cover D. Light-gauge leads 15 and 16 from the battery connector-clip 28 are connected to locations x and y on the printed circuit board, but these leads are not shown in their full length to avoid crowding the figure. Note that the leads from the battery-charge jack 24 connecting the jack to the battery 13, and the charge-dropping resistor 27 are shown in the FIG. 5 schematic only, inasmuch as these are not essential features of the invention.

The generator is activated by pressing the button 17 of the switch assembly 18, connecting battery voltage to the noise module; this causes the moveable contact of the relay 2 to vibrate and sparking results in the back contacts A and B of the relay, as a result of the circuit arrangement shown in the schematic of FIG. 5. Contact C of relay 2 is not connected in the circuit.

The sparking contacts are electrically connected to the base of the RF antenna assembly 14 by means of a wire 9 leading from the noise module M to a solder lug 10 secured to the base of the antenna assembly with nut 26. This connection causes the antenna to radiate RF at low level throughout the medium frequency (MF), high frequency (HF), very high frequency (VHF), and ultra high frequency (UHF) ranges. The sparking contacts also generate the aforementioned ultrasonic and audio emissions.

The activating switch assembly 18 used is unique in that it will provide momentary-on operation by pressing its button 17 lightly and will provide steady-on or steady-off operation by pressing its button firmly. Note that in the schematic of FIG. 5, two switches numbered 17 are shown. This is to illustrate that the button of the switch can provide either momentary-operation (top symbol) of steady-operation (bottom symbol).

The antenna assembly consists of a base 14, a bushing 20 and an extendable whip 22. The whip extends to about two times the height of the enclosure. It is shown about half-extended in FIG. 1 and fully retracted in FIG. 2. The antenna assembly is held in place by its bushing 20 and nut 21. To provide stability and good alignment a stud 23 protruding from the bottom of the antenna assembly is threaded into a hole in the bottom of the enclosure. The use of an extendable antenna rather than a fixed length of antenna provides a truly pocket-type device; also it provides an output level adjustment, with less RF being radiated with a shorter antenna extension.

An internally-threaded socket fitting 25 is installed in the bottom of the enclosure. This has a standard ¼-20NC thread as used with photographic tripods, to permit mounting the device on such a tripod, or for other mounting. This fitting is secured into the base of the enclosure by swaging, cementing or other means.

The above description shall not be construed as limiting the ways in which this invention may be practiced but shall be inclusive or many other variations that do not depart from the broad interest and intent of the invention.

An example of such a variation is that of making a simple internal modification of the noise generator whereby RF radiation is limited to either: medium frequencies or high frequencies and above; this while maintaining the audio and ultrasonic outputs. Filter capacitor (F), shown only on the schematic of FIG. 5, illustrates such a frequency-limiting variation.

Having now described my invention and the manner in which it may be used, I claim:

1. An audio, ultrasonic and radio frequency (RF) generator including:
    a. an enclosure,
    b. a sparking noise module within the enclosure which simultaneously emits low-level audio, ultrasonic, and RF medium frequency (MF), high frequency (HF), very high frequency (VHF), and ultra high frequency (UHF) radiations,
    c. a low-voltage battery power supply,
    d. an RF-radiating antenna located on the enclosure,
    e. a diaphragm on the enclosure for transmitting said audio and ultrasonic radiations,
    f. a switch on the enclosure for activating the noise generator.

2. An audio, ultrasonic and RF generator of claim 1 including a compact and pocket-size enclosure.

3. An audio, ultrasonic and RF generator of claim 1 including an antenna that can be retracted into the enclosure.

4. An audio, ultrasonic and RF generator of claim 1 wherein the RF output level may be adjusted by changing the length of an extendable antenna.

5. An audio, ultrasonic and RF generator of claim 1 which operates with a safe low-voltage power supply.

6. An audio, ultrasonic and RF generator of claim 1 wherein a threaded socket is provided in the bottom of said enclosure to permit mating with the standard mounting-screw of a photographic tripod, and permit mounting on such a tripod or other support.

7. An audio, ultrasonic and RF generator of claim 1 including a single push-type SPST switch with the feature of permitting steady on-off switching action or momentary-on switching action.

8. An audio, ultrasonic, and RF generator of claim 1 including a small-gap sparking noise module consisting principally of a low voltage electromagnetic relay with sparking back contacts.

9. An audio, ultrasonic and RF noise generator of claim 1 including means for mounting the noise module such that audio emissions are reduced while ultrasonic and RF radiations remain at normal generator level.

10. An audio, ultrasonic and RF generator of claim 1 wherein the noise module is mounted on a printed circuit board with provisions on this board for a free-hanging suspension within the enclosure.

11. An audio, ultrasonic and RF generator of claim 1 wherein the printed circuit board of the noise module is oriented so as to be substantially parallel to the diaphragm for good ultrasonic activation of the diaphragm.

12. An audio, ultrasonic and RF generator of claim 1 wherein the noise module is suspended by light-gauge stranded wires which also act as connecting-wires for the electrical circuitry.

13. A generator of claim 1 designed such that the simple addition of a filter capacitor to the circuit within said enclosure will cause the RF frequency range to be limited while maintaining the audio and ultrasonic radiations.

14. An audio, ultrasonic and RF noise generator of claim 1 which provides a broad-frequency-spectrum isolated noise source for antenna and other tests.

* * * * *